(12) United States Patent
Ghasemi Afshar et al.

(10) Patent No.: US 11,004,834 B2
(45) Date of Patent: May 11, 2021

(54) LED UNIT

(71) Applicant: OSRAM Opto Semiconductors GmbH, Regensburg (DE)

(72) Inventors: Farhang Ghasemi Afshar, Wenzenbach (DE); Ralph Wirth, Lappersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/484,459

(22) PCT Filed: Feb. 6, 2018

(86) PCT No.: PCT/EP2018/052922
§ 371 (c)(1),
(2) Date: Aug. 8, 2019

(87) PCT Pub. No.: WO2018/146084
PCT Pub. Date: Aug. 16, 2018

(65) Prior Publication Data
US 2019/0371769 A1    Dec. 5, 2019

(30) Foreign Application Priority Data
Feb. 9, 2017  (DE) .................... 10 2017 102 619.3

(51) Int. Cl.
*H01L 25/075* (2006.01)
*H01L 27/15* (2006.01)
(Continued)

(52) U.S. Cl.
CPC ........ *H01L 25/0753* (2013.01); *H01L 27/153* (2013.01); *H01L 33/50* (2013.01);
(Continued)

(58) Field of Classification Search
None
See application file for complete search history.

(56) References Cited

U.S. PATENT DOCUMENTS 7,309,144 B2 * 12/2007 Foong ................. H01L 25/0756
257/E25.021
7,922,352 B2 * 4/2011 Chua ................... H01L 25/0756
362/231

(Continued)

FOREIGN PATENT DOCUMENTS

DE   102016212138 A1   1/2018
EP       1433831 A1   6/2004
EP       2711993 A1   3/2014

OTHER PUBLICATIONS

Search Report for the corresponding German Patent Application No. 10 2017 102 619.3 (8 pages) dated Oct. 6, 2017.
(Continued)

*Primary Examiner* — Robert K Carpenter
(74) *Attorney, Agent, or Firm* — Viering, Jentschura & Partner MBB (57) ABSTRACT

An LED unit comprises a substrate and a first LED chip. The first LED chip may include a first light-emitting surface arranged on the substrate in such a way that light emitted from the first LED chip radiates in a direction of radiation of the LED unit. The LED unit includes a second LED chip comprising a second light-emitting surface and arranged above the first LED chip in such a way that the second LED chip at least partially covers the first LED chip and radiates light emitted from the second LED chip in the direction of radiation of the LED unit. The LED unit comprises a first conversion layer at least partially covering the first light-emitting surface and/or at least partially laterally surrounding the first LED chip. A second conversion layer at least partially covers the second LED chip.

17 Claims, 3 Drawing Sheets

(51) Int. Cl.
*H01L 33/50* (2010.01)
*H01L 33/52* (2010.01)
*H01L 33/60* (2010.01)

(52) U.S. Cl.
CPC .............. *H01L 33/52* (2013.01); *H01L 33/60* (2013.01); *H01L 2933/0091* (2013.01)

(56) References Cited

U.S. PATENT DOCUMENTS

| | | | |
|---|---|---|---|
| 8,952,407 B2* | 2/2015 | Son | H01L 25/0753 257/98 |
| 2009/0134409 A1* | 5/2009 | Wang | H01L 25/0756 257/89 |
| 2011/0305026 A1* | 12/2011 | Mochizuki | F21V 7/0091 362/308 |
| 2012/0130166 A1 | 5/2012 | Nishimura et al. | |
| 2014/0145225 A1 | 5/2014 | Wu et al. | |
| 2015/0048390 A1 | 2/2015 | Imazu et al. | |
| 2015/0048394 A1 | 2/2015 | Shim et al. | |

OTHER PUBLICATIONS

International Search Report for the corresponding PCT Application No. PCT/EP2018/052922 (3 pages) dated Apr. 9, 2018.

* cited by examiner

LED UNIT

CROSS-REFERENCE TO RELATED APPLICATIONS

The present application is a national stage entry according to 35 U.S.C. § 371 of PCT application No.: PCT/EP2018/052922 filed on Feb. 6, 2018; which claims priority to German Patent Application Serial No.: 10 2017 102 619.3, which was filed on Feb. 9, 2017; all of which are incorporated herein by reference in their entirety and for all purposes.

TECHNICAL FIELD

The present invention relates to an LED unit including a substrate, two LED chips and two conversion layers. The invention furthermore relates to an LED module in which a plurality of LED units are arranged.

BACKGROUND

LED units are known to include a substrate, a housing and an LED chip, which is arranged in a recess of the housing. The LED chip may, for example, be a surface emitter or a volume emitter. A surface emitting LED chip typically has one electrical contact on its upper side and one electrical contact on its lower side. A volume-emitting LED chip typically has both electrical contacts on its upper side. Furthermore, LED chips are also known which are configured as a flip-chip. A flip-chip typically has both electrical contacts on its lower side.

One or more light-emitting surfaces of the LED chip may be covered with a conversion element or a conversion layer, for converting the light generated by the LED chip in respect of its wavelength. As an alternative or in addition, the LED chip in the recess of the housing may be embedded in an encapsulation compound. The encapsulation compound may, for example, include scattering particles and/or converter material. The formation of electromagnetic radiation of a second wavelength from electromagnetic radiation of a first wavelength (LED chip) is referred to as wavelength conversion. Wavelength conversion is used in light-emitting diodes for color conversion, for example in order to simplify the generation of white light. In this case, for example, a blue light (LED chip) is converted into a yellow light. The color mixing of blue light and yellow light forms white light. A conversion element includes a converter material, also referred to as a phosphor. The conversion element may be arranged in the light path of a light-emitting diode for the wavelength conversion. For example, a light-emitting diode may thus have an InGaN-based blue- or UV-emitting chip and a conversion element.

One disadvantage of the known LED units is that LED units with a high luminous flux and a high luminance often cannot be produced in a desired compact design.

SUMMARY

An LED unit is provided, wherein a high luminance and a high luminous flux are achieved in a straightforward way. Furthermore, the LED unit can be produced simply and economically in a compact design. It is another object to provide an LED module which includes a plurality of advantageous LED units.

One embodiment of the LED unit includes a substrate and a first LED chip. The first LED chip includes a first light exit surface and the first LED chip is arranged on the substrate in such a that light emitted by the first LED chip is emitted in an emission direction of the LED unit. The LED unit furthermore includes a second LED chip, which includes a second light exit surface and the second LED chip is arranged over the first LED chip in such a way that the second LED chip at least partially covers the first LED chip and light emitted by the second LED chip is emitted in the emission direction of the LED unit. In addition, the LED unit includes a first conversion layer and a second conversion layer. The first conversion layer at least partially covers the first light exit surface and/or at least partially laterally encloses the first LED chip, and the second conversion layer at least partially encapsulates the second LED chip.

The fact that the first converter at least partially laterally encloses the first chip means that side surfaces of the first chip which are adjacent to the first light exit surface are at least partially enclosed. For the spatial arrangement of the first converter, two configurations are therefore possible. In the first configuration, the first converter at least partially covers the first light exit surface. At the same time, the first converter at least partially encloses the side surfaces of the first chip which are adjacent to the first light exit surface. In the second configuration, the converter does not cover the first light exit surface. It only encloses the side surfaces of the first chip which are adjacent to the first light exit surface.

The substrate may include a ceramic base body. Electrical lines for electrical contacting of the LED chips are formed on the base body. The substrate may include ceramic and/or glass and/or sapphire. For example, it may consist of ceramic and/or glass and/or sapphire. It is, however, also possible for the substrate to be produced in a leadframe technology. In this case, a relatively large metal plate is structured in such a way that a multiplicity of electrical contact structures are predefined by stamping, and the intermediate spaces produced are filled with a thermoplastic or a silicone as an insulating material. In this case, the electrical conductor tracks and the electrical contact surfaces are formed directly by the leadframe.

The first and second LED chips may be surface-emitting and/or volume-emitting LED chips. In one non-limiting configuration, the first LED chip is a flip-chip. The first and second LED chips may emit light of the same wavelength or different wavelength. The first and second LED chips may be configured as a sapphire chip.

A principal emission direction may, for the respective LED chip or an LED unit, be understood as that direction which corresponds to a symmetry axis of the light emitted by it. The principal emission direction may correspond to a direction with a maximum luminous flux, or a maximum luminous intensity.

A principal emission surface may, for the respective LED chip, be understood as that surface over which the maximum luminous flux, or the maximum luminous intensity, is emitted. The first light exit surface of the first LED chip may form a principal emission surface of the first LED chip. The second light-emitting surface of the second LED chip may form a principal emission surface of the second LED chip.

The first and second conversion layers may respectively include a carrier material in which converter material and/or scattering particles are embedded. The converter material may include converter particles. As an alternative thereto, the conversion layers may be formed from the converter material. The converter material is suitable for converting light in respect of its wavelength. For example, the LED chips emit blue light, and the converter material absorbs at least a part of the blue light and emits yellow light or mint-green light. The yellow or mint-green light mixes with the remaining unconverted blue light, so that white light can be generated. As an alternative thereto, the blue light may be converted by means of the converter material into yellow light, and the blue light may be converted into blue-white (bluish-white) light by a different converter material, so that adjustable white light can be generated. The first and second conversion layers may include one or more converter materials. The first and second conversion layers may include the same converter materials or different converter materials.

It is one configuration that the substrate includes a reflective surface. The reflective surface of the substrate may be formed from the base material of the substrate, for example metal. It is furthermore possible for the reflective surface to include a reflective coating, for example titanium dioxide embedded in a matrix material such as silicone. It is also possible for the reflective surface to include or be formed by a metallization, for example an aluminum layer or a silver layer, or a white coating material.

During operation of the LED unit, the effect of the reflective surface is that a particularly high proportion of the emitted light is emitted through the light exit surfaces. This may contribute to a particularly high efficiency of the LED unit, since optical losses in the LED unit are minimized.

According to one refinement of the LED unit, the first LED chip and the second LED chip include separate, spatially separated current contacts.

The spatially separated current contacts make it possible to operate the first and second LED chips with different electrical parameters. In the LED unit, it is possible to use LED chips and conversion layers which emit light at different wavelengths. For example, the first LED chip with the first conversion layer may emit first light, and the second LED chip with the second conversion layer may emit second light. The first light may for example be warm-white light, and the second light may for example be blue-white light. In order to optimize the entire luminous flux and the luminance of the LED unit, it may be technically advantageous to operate the first LED chip with a higher electrical current than the second LED chip. The higher electrical loading of the first LED chip causes a higher thermal loading in comparison with the electrically less loaded second LED chip. Since the substrate may be optimized in respect of its thermal conductivity, the thermal loading which takes place in the first LED chip may be dissipated more effectively through the substrate.

According to one refinement of the LED unit, the first conversion layer is adapted to convert the light emitted by the first LED chip into warm-white light.

The term "warm-white light" is intended here to mean that the color temperature of the emitted light lies in the range of from about 2700 K to about 3500 K.

The term "color temperature" is intended here to mean the temperature of a blackbody, the so-called Planckian radiator, which is associated with a particular color of the light that is emitted by this radiation source. Specifically, it is the temperature whose light effect, at the same brightness and under established observation conditions, is most similar to the color to be described. The color temperature is a measure for quantitatively determining a respective color impression of a light source.

According to one refinement of the LED unit, the second conversion layer is adapted to convert the light emitted by the second LED chip into cold-white light.

The term "cold-white light" is intended here to mean that the color temperature of the emitted light lies in the range of from about 5000 K to about 10000 K.

According to one refinement of the LED unit, the first conversion layer and the second conversion layer are matched to one another in such a way that the light emitted during sole operation of the first LED chip is converted into warm-white light.

The light with a first wavelength emitted by the first LED chip is mostly converted in the first conversion layer into light of a second wavelength. It is possible however that a small proportion of the light emitted by the first LED chip passes through the first conversion layer without wavelength conversion taking place. Light emitted by the first LED chip may therefore strike the second conversion layer and be converted into light of a third wavelength. It is, however, also possible that the light of the first wavelength is converted neither in the first nor in the second conversion layer. The first conversion layer and the second conversion layer are matched to one another in such a way that the light emitted during sole operation of the first LED chip is converted into warm-white light. In other words, the light mixture of light with the first, second and third wavelengths corresponds to warm-white light.

According to one refinement of the LED unit, the first conversion layer and the second conversion layer are matched to one another in such a way that the light emitted during sole operation of the second LED chip is converted into cold-white light.

The light with a first wavelength emitted by the second LED chip is mostly converted in the second conversion layer into light of a second wavelength. It is possible however that a small proportion of the light emitted by the second LED chip passes through the second conversion layer without wavelength conversion taking place. Light emitted by the second LED chip may therefore strike the first conversion layer and be converted into light of a third wavelength. It is, however, also possible that the light of the first wavelength is converted neither in the second nor in the first conversion layer. The first conversion layer and the second conversion layer are matched to one another in such a way that the light emitted during sole operation of the second LED chip is converted into cold-white light. In other words, the light mixture of light with the first, second and third wavelengths corresponds to cold-white light.

According to one refinement of the LED unit, the color temperature of the light emitted by the LED unit can be adjusted between 2700 K and 10000 K.

An adjustable color temperature of the emitted light of the LED unit may be achieved in that, on the one hand, the first and second LED chips are operated with different electrical parameters, and on the other hand the combinations of the first LED chip and the first conversion layer as well as the second LED chip and the second conversion layer respectively emit light with a different color temperature. A color temperature of 2700 K may be achieved in that only the first LED chip of the LED unit is supplied with electrical energy. The light emitted by the first LED chip is converted with the aid of the first and second conversion layers into light with a color temperature of 2700 K. A color temperature of 10000 K may be achieved in that only the second LED chip of the LED unit is supplied with electrical energy. The light emitted by the second LED chip is converted with the aid of the second and first conversion layers into light with a color temperature of 10000 K. A color temperature of between 2700 K and 10000 K of the emitted light of the LED unit may be achieved in that the first LED chip and the second LED chip are operated with suitable electrical parameters. In the configuration of the LED unit as described above, a change in the electrical working point of the first LED chip or of the second LED chip leads to a change in the luminous flux, the luminance and the color temperature.

According to one refinement of the LED unit, the first LED chip and/or the second LED chip includes mirroring in the region of an arrangement surface with respect to the substrate or with respect to the first LED chip.

The light generated in the first and second LED chips may be emitted into the entire solid angle. In order to minimize absorption losses on the arrangement surfaces of the LED chips, the first and second LED chips may include mirroring in the region of their arrangement surface. Light incident on the mirroring is reflected back into the LED unit and is therefore still available as light to the LED unit. The mirroring may for example include or be formed by a metallization, for example an aluminum layer or a silver layer, a white coating material and/or titanium dioxide.

According to one refinement of the LED unit, the second light exit surface is at least partially covered with a translucent layer.

The height extent of the second conversion layer over the second light exit surface is smaller in comparison with the lateral extent of the second conversion layer with respect to the second LED chip. By virtue of the smaller height extent, an increased radiation proportion of the light emitted by the second LED chip, for example blue light, can leave the LED unit unconverted. The blue light proportion of the light emitted by the LED unit is therefore increased. By virtue of a translucent layer which at least partially covers the second light exit surface, a proportion of the light emitted by the second LED chip, for example blue light, is absorbed. The blue light proportion of the light emitted by the LED unit can therefore be reduced.

The use of a translucent layer may be advantageous when, for example, the first LED chip and the second LED chip emit blue light and the LED unit is intended to emit light with a color temperature of less than 5000 K.

According to one refinement of the LED unit, the translucent layer includes a silicone layer having particles configured for light scattering dispersed therein.

By virtue of the silicone layer, a determined proportion of the light emitted by the second LED chip can be absorbed in a technically defined way. The scattering particles embedded in the silicone layer enhance the effect of a uniformly illuminating surface.

According to one refinement of the LED unit, the second light exit surface is at least partially covered with a reflective layer.

The effect achievable by the use of a reflective layer is that light emitted by the second LED chip cannot pass through the second light exit surface. The light emitted by the second LED chip is reflected at the layer and can leave the second LED chip through the side surfaces thereof. Subsequently, the emitted light may be converted in the second conversion layer. The reflective layer may for example include or be formed by a metallization, for example an aluminum layer or a silver layer, a white coating material and/or titanium dioxide.

The use of a reflective layer may be advantageous when, for example, the first LED chip and the second LED chip emit blue light and the LED unit is intended to emit light with a color temperature of less than 3500 K.

According to one refinement of the LED unit, a housing wall is arranged on the substrate or laterally with respect to the substrate, which wall extends in the direction of the emission direction. The housing wall fully encloses the first LED chip and the second LED chip, the internal height of the housing wall being greater than the height of the arrangement consisting of the first LED chip and the second LED chip.

The arrangement of a housing wall on the substrate or laterally with respect to the substrate may simplify the production of the LED unit. After the first and second LED chips are arranged on the substrate, the housing wall is arranged. The housing wall fully encloses the first and second LED chips, and therefore forms a cavity which may subsequently be filled in a straightforward way with one or more conversion layers. The housing wall prevents lateral spreading of the conversion layer, and permits exact quantity dosing of the conversion layer. Subsequently, the LED unit may be processed further by conventional pick-and-place technology.

It is one configuration that the housing wall includes a reflective surface. The reflective surface of the housing wall may be formed from the base material of the housing wall, for example plastic. It is furthermore possible for the reflective surface to include a reflective coating, for example titanium dioxide embedded in a matrix material such as silicone. It is also possible for the reflective surface to include or be formed by a metallization, for example an aluminum layer or a silver layer, or a white coating material. During operation of the LED unit, the effect of the reflective surface is that a particularly high proportion of the emitted light can be reflected at the surface and is still available to the LED unit. This may contribute to a particularly high efficiency of the LED unit, since optical losses in the LED unit are minimized.

It is one configuration that the housing wall has a wedge-shaped basic shape, the width of the housing wall decreasing in the direction of the emission direction. During operation of the LED unit, the effect of the wedge-shaped housing wall is that an increased proportion of the light striking the housing wall is reflected obliquely back into the LED unit. This may contribute to particularly good color mixing of the emitted light of the LED unit.

The object is also achieved by an LED module which includes a plurality of LED units.

The LED module may include a plurality of LED units, the individual LED units being of the same design and/or configured differently. It is therefore possible to use, in the LED module, LED units which include different first LED chips and/or second LED chips and/or first conversion layers and/or second conversion layers. It is therefore possible, by a deliberate selection of the LED units to be used, to optimize the LED module in respect of one or more lighting technology specifications, such as luminous flux, luminance or color temperature.

According to one refinement of the LED module, all the LED units include a common substrate.

The use of a common substrate makes it possible to produce a compact LED module which is simple to produce.

It is one configuration that a plurality of LED units on the common substrate form a group and are electrically conductively connected to one another in a series and/or parallel circuit. It is also possible for a plurality of groups of LED units to be arranged on the common substrate. Each group may be supplied with uniform or different electrical parameters. It is furthermore possible to connect a plurality of groups electrically conductively to one another in a series and/or parallel circuit. It is therefore possible, by a deliberate selection of the LED units to be used, by deliberate electrical interconnection of the LED units to form one or more groups, by deliberate electrical interconnection of the groups and by suitable selection of the electrical operating parameters for each group, to optimize the LED module in respect of one or more lighting technology specifications, such as luminous flux, luminance or color temperature.

According to one refinement of the LED module, a housing wall is arranged on the substrate or laterally with respect to the substrate, which wall extends in the direction of the emission direction. The housing wall fully encloses the LED units, the height of the housing wall being greater than the height of the arrangements consisting of first LED chips and second LED chips.

The arrangement of a housing wall on the common substrate or laterally with respect to the common substrate may simplify the production of the LED module. After the LED units are arranged on the common substrate, the housing wall is arranged. The housing wall fully encloses the LED chips, and therefore forms a cavity which may subsequently be filled in a straightforward way with one or more conversion layers. The housing wall prevents lateral spreading of the conversion layer, and permits exact dosing of the conversion layer. Subsequently, the LED module may be processed further by conventional pick-and-place technology.

It is one configuration that the housing wall includes a reflective surface. The reflective surface of the housing wall may be formed from the base material of the housing wall, for example plastic. It is furthermore possible for the reflective surface to include a reflective coating, for example titanium dioxide embedded in a matrix material such as silicone. It is also possible for the reflective surface to include or be formed by a metallization, for example an aluminum layer or a silver layer, or a white coating material. During operation of the LED module, the effect of the reflective surface is that a particularly high proportion of the emitted light can be reflected at the surface and is still available to the LED module. This may contribute to a particularly high efficiency of the LED module, since optical losses in the LED module are minimized.

It is one configuration that the housing wall has a wedge-shaped basic shape, the width of the housing wall decreasing in the direction of the emission direction. During operation of the LED module, the effect of the wedge-shaped housing wall is that an increased proportion of the light striking the housing wall is reflected obliquely back into the LED module. This may contribute to particularly good color mixing of the emitted light of the LED module.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the illumination apparatus. In the following description, various aspects are described with reference to the following drawings, in which.

DETAILED DESCRIPTION

Figure 1:
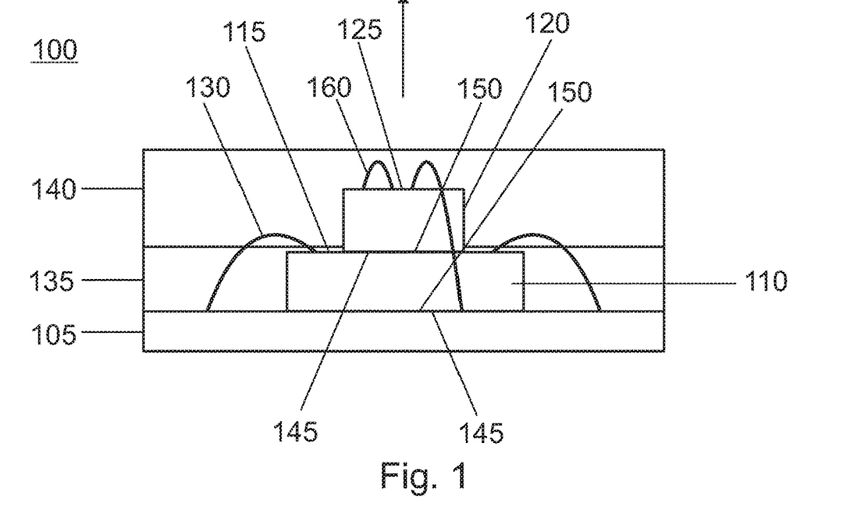
FIG. 1 shows a schematic representation of an LED unit according to a first embodiment in a sectional representation.

FIG. 1 shows a schematic representation of an LED unit 100 according to a first embodiment in a sectional representation. The LED unit 100 includes a substrate 105 having a first LED chip 110 arranged over the substrate 105, which includes a first light exit surface 115 and is arranged on the substrate in such a way that light emitted by it is emitted in an emission direction Z of the LED unit 100. The LED unit 100 furthermore includes a second LED chip 120, which includes a second light exit surface 125 and is arranged over the first LED chip 110 in such a way that the second LED chip 120 at least partially covers the first LED chip 110 and light emitted by it is emitted in the emission direction Z of the LED unit 100. The LED unit 100 furthermore includes a first conversion layer 135 and a second conversion layer 140, wherein the first conversion layer 135 at least partially covers the first light exit surface 115 and laterally encloses the first LED chip 110. The second conversion layer 140 at least partially encapsulates the second LED chip 120.

The first light exit surface 115 of the first LED chip 110 may be configured as a principal light emission surface of the first LED chip 110. The second light exit surface 125 of the second LED chip 120 may be configured as a principal emission surface of the second LED chip 120. The emission direction Z may be configured as a principal emission direction of the LED unit.

The substrate 105 has been produced with the aid of a leadframe technology. If a particularly high thermal conductivity of the substrate 105 is required, the substrate 105 may also be configured as a metal-core printed circuit board or a ceramic printed circuit board.

The first LED chip 110 and the second LED chip 120 are respectively a volume-emitting LED chip, which respectively has its electrical contacts on its upper side. The electrical contacting between the first LED chip 110 and respectively the second LED chip 120 and the substrate 105 is carried out by wires 130, 160, the so-called bonding wires 130, 160. One end of the wires 130, 160 is connected to the electrical contacts, located on the upper side (see FIG. 2), of the respective LED chips 110, 120. The second end of the wires is connected to the electrical conductor tracks of the substrate 105.

The second LED chip 120 has been fixed with the aid of a transparent and UV-resistant adhesive over the first LED chip. The thickness of the adhesive layer lies in the range of from 5 μm to 10 μm. The first LED chip 110 has been fixed on the substrate 105 by means of an adhesive or a solder.

The first LED chip 110 and the second LED chip 120 respectively include metallic mirroring 150 in the region of their arrangement surface 145 with respect to the substrate 105 or with respect to the first LED chip 110. The light generated in the first and second LED chips 110, 120 is emitted into the entire solid angle. Light striking the mirroring 150 is reflected back into the LED unit 100, and is therefore still available as light to the LED unit 100. The mirroring minimizes the absorption losses on the arrangement surfaces 145 of the LED chips 110, 120.

The light emitted by the first LED chip 110 is converted by the first conversion layer 135 into warm-white light, i.e.

light with a color temperature of from about 2700 K to about 3500 K. The light emitted by the second LED chip 120 is converted by the second conversion layer 140 into cold-white light, i.e. light with a color temperature of from about 5000 K to about 10000 K.

By virtue of the separate, spatially separated current contacts for the first and second LED chips 110, 120, each LED chip 110, 120 of the LED unit 100 can be operated with individual electrical parameters. The LED unit 100 may correspondingly be adjusted for predetermined lighting technology requirements. In the embodiment described above, it is therefore possible for the LED unit 100 to emit light with a color temperature of from about 2700 K about 10000 K. A color temperature of about 2700 K is achieved in that only the first LED chip 110 of the LED unit 100 is supplied with electrical energy. A color temperature of about 10000 K is achieved in that only the second LED chip 120 of the LED unit 100 is supplied with electrical energy. A color temperature of the emitted light of the LED unit 100 between the two limit values of about 2700 K and about 10000 K is achieved by the selection of suitable electrical working points for the first LED chip 110 and for the second LED chip 120. In the configuration of the LED unit as described above, a change in the electrical working point of the first LED chip or of the second LED chip leads to a change in the luminous flux, the luminance and the color temperature.

Figure 2A:
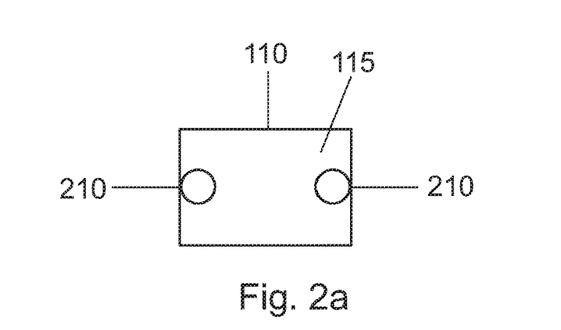
FIGS. 2a, 2b and 2c show a schematic representation of the electrical contacting of an LED unit according to a first embodiment in a plan view.
Figure 2B:
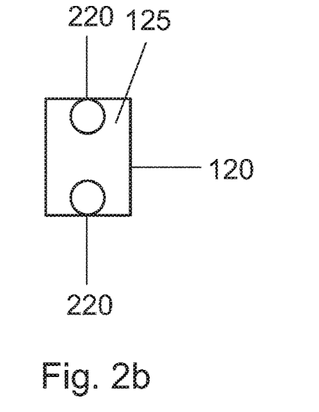
Figure 2C:
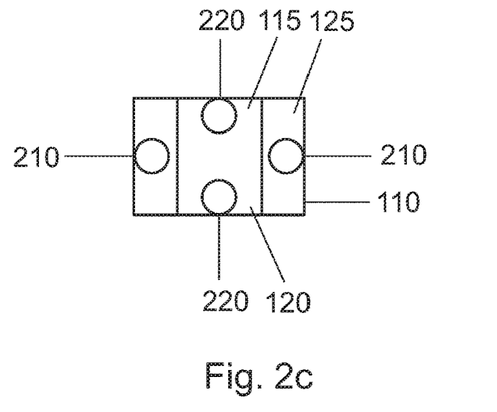

FIGS. 2a, 2b and 2c show a schematic representation of the electrical contacting of an LED unit according to a first embodiment in a plan view. FIG. 2a shows the first light exit surface 115 of the surface-emitting first LED chip 110. The two current contacts 210, to which the bonding wires 130 (not represented in FIG. 2a) are connected, are arranged on the first light exit surface 115. FIG. 2b shows the second light exit surface 125 of the surface-emitting second LED chip 120. The two current contacts 220, to which the bonding wires 160 (not represented in FIG. 2b) are connected, are arranged on the second light exit surface 125. FIG. 2c shows the spatial position of the current contacts 210, 220 when the second LED chip 120 is arranged over the first LED chip 110.

Figure 3:
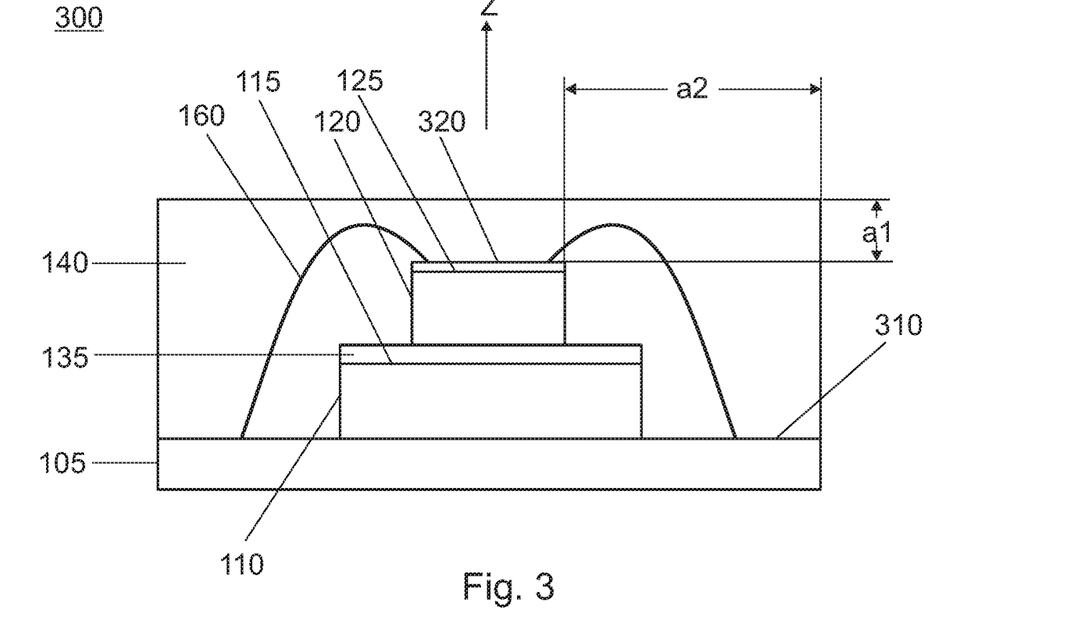
FIG. 3 shows a schematic representation of an LED unit according to a second embodiment in a sectional representation.

FIG. 3 shows a schematic representation of an LED unit 300 according to a second embodiment in a sectional representation. The LED unit 300 includes a substrate 105 having a first LED chip 110 arranged over the substrate 105, which includes a first light exit surface 115 and is arranged on the substrate in such a way that light emitted by it is emitted in an emission direction Z of the LED unit 300. The LED unit 300 furthermore includes a second LED chip 120, which includes a second light exit surface 125 and is arranged over the first LED chip 110 in such a way that the second LED chip 120 at least partially covers the first LED chip 110 and light emitted by it is emitted in the emission direction Z of the LED unit 300. The LED unit 300 furthermore includes a first conversion layer 135 and a second conversion layer 140, wherein the first conversion layer 135 covers the first light exit surface 115 and the second conversion layer 140 encapsulates the first and second LED chips 110, 120.

The first light exit surface 115 of the first LED chip 110 may be configured as a principal light emission surface of the first LED chip 110. The second light exit surface 125 of the second LED chip 120 may be configured as a principal emission surface of the second LED chip 120. The emission direction Z may be configured as a principal emission direction of the LED unit.

The substrate 105 has been produced with the aid of a leadframe technology. If a particularly high thermal conductivity of the substrate 105 is required, the substrate 105 may also be configured as a metal-core printed circuit board or a ceramic printed circuit board. The substrate 105 includes a reflective surface 310. The reflective surface 310 is formed from the basic material of the substrate 105, from a reflective coating or a metallization.

The first LED chip 110 is a surface-emitting LED chip, which is configured as a flip-chip. The flip-chip has its electrical contacts on the lower side. The second LED chip 120 is a volume-emitting LED chip, which has its electrical contacts on its upper side. The electrical contacting between the first LED chip 110 and the substrate 105 is carried out directly via the electrical contacts located on the lower side of the LED chip 110 and the conductor tracks of the substrate 105. An electrically conductive connection between the electrical contacts of the first LED chip 110 and the substrate 105 is ensured with the aid of a solder or a conductive adhesive. The electrical contacting between the second LED chip 110 and the substrate 105 is carried out using wires 160, the so-called bonding wires. One end of the bonding wires 160 is for this purpose connected to the electrical contacts, located on the upper side, of the LED chip 120. The second end of the wires is connected to the electrical conductor tracks of the substrate 105. The second LED chip 120 has been fixed with the aid of a transparent and UV-resistant adhesive over the first LED chip. The thickness of the adhesive layer lies in the range of from 5 μm to 10 μm. The first LED chip 110 has been fixed on the substrate 105 by means of a conductive adhesive or a solder.

The light emitted by the first LED chip 110 is converted by the first conversion layer 135 into warm-white light, i.e. light with a color temperature of from about 2700 K to about 3500 K. The light emitted by the second LED chip 120 converted by the second conversion layer 140 into cold-white light, i.e. light with a color temperature of from about 5000 K to about 10000 K.

The first conversion layer 135 is arranged directly on the first light exit surface 115. In this case this is a ceramic converter. The ceramic converter includes a ceramic base body, which contains the converter materials required for the wavelength conversion. The ceramic base body has been fixed by means of a transparent and UV-resistant adhesive on the light exit surface 115. The second conversion layer 140 fully encapsulates the first and second LED chips 110, 120.

A translucent layer 320 is arranged over the second light exit surface 125. The height extent a1 of the second conversion layer 140 over the second light exit surface 125 is smaller in comparison with the lateral extent a2 of the second conversion layer 140 with respect to the second LED chip 120. By virtue of the smaller height extent a1, an increased radiation proportion of the light emitted by the second LED chip 120 can leave the LED unit unconverted. By a translucent layer 320 which covers the second light exit surface 125, a proportion of the light emitted by the second LED chip 120 is absorbed. The unconverted radiation proportion of the light emitted by the LED unit 300 is therefore reduced.

The translucent layer 320 includes a silicone layer having particles configured for light scattering. A certain proportion of the light emitted by the second LED chip 120 is absorbed by the silicone layer. The scattering particles embedded in the silicone layer 320 enhance the effect of a uniformly illuminating surface.

Figure 4:
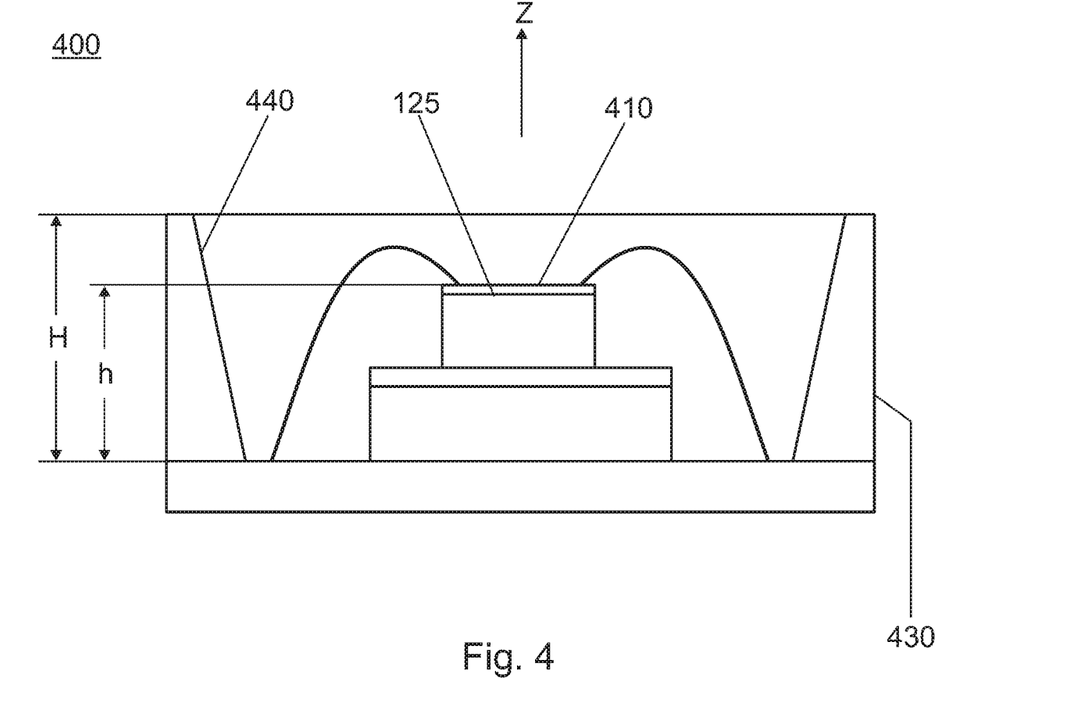
FIG. 4 shows a schematic representation of an LED unit according to a third embodiment in a sectional representation.

FIG. 4 shows a schematic representation of an LED unit 400 according to a second embodiment in a sectional representation. The LED unit 400 is configured according to the LED unit 300. In respect of the basic description of the LED unit 400, reference is made to the description of FIG. 3. The LED unit 400 has been modified in relation to the LED unit 300 in the following points.

A housing wall 430, which extends in the direction of the emission direction Z, is arranged on the substrate 105. The housing wall fully encloses the first LED chip 110 and the second LED chip 120, the internal height H of the housing wall being greater than the height h of the arrangement consisting of the first LED chip 110 and the second LED chip 120.

The housing wall 430 includes a reflective surface 440. The reflective surface 440 of the housing wall 430 is formed from the base material of the housing wall, a plastic. It is furthermore possible for the reflective surface 440 to include a reflective coating, for example titanium dioxide embedded in a matrix material such as silicone. It is also possible for the reflective surface 440 to include or be formed by a metallization, for example an aluminum layer or a silver layer, or a white coating material. During operation of the LED unit 400, the effect of the reflective surface 430 is that a particularly high proportion of the emitted light is reflected at the surface and is still available to the LED module 400. This contributes to a particularly high efficiency of the LED unit, since optical losses in the LED unit are minimized.

The housing wall 430 has a wedge-shaped basic shape, the width of the housing wall 430 decreasing in the direction of the emission direction Z. During operation of the LED unit 400, the effect of the wedge-shaped housing wall 430 is that an increased proportion of the light striking the housing wall 430 is reflected obliquely back into the LED unit 400. This contributes to particularly good color mixing of the emitted light of the LED unit.

A reflective layer 410 is arranged over the second light exit surface 125. The effect achieved by using a reflective layer 410 is that light emitted by the second LED chip 120 can pass through the second light exit surface 125. The light emitted by the second LED chip 120 is reflected at the layer 410 and can leave the second LED chip through its side surfaces. Subsequently, the emitted light may be converted in the second conversion layer 140. The unconverted radiation proportion of the light emitted by the LED unit 400 is therefore minimized.

The reflective coating 410 may for example include or be formed by a metallization, for example an aluminum layer or a silver layer, a white coating material and/or titanium dioxide.

The use of a reflective layer is advantageous when, for example, the first LED chip 110 and the second LED chip 120 emit blue light and the LED unit 400 is intended to emit light with a color temperature of less than 3500 K.

Figure 5:
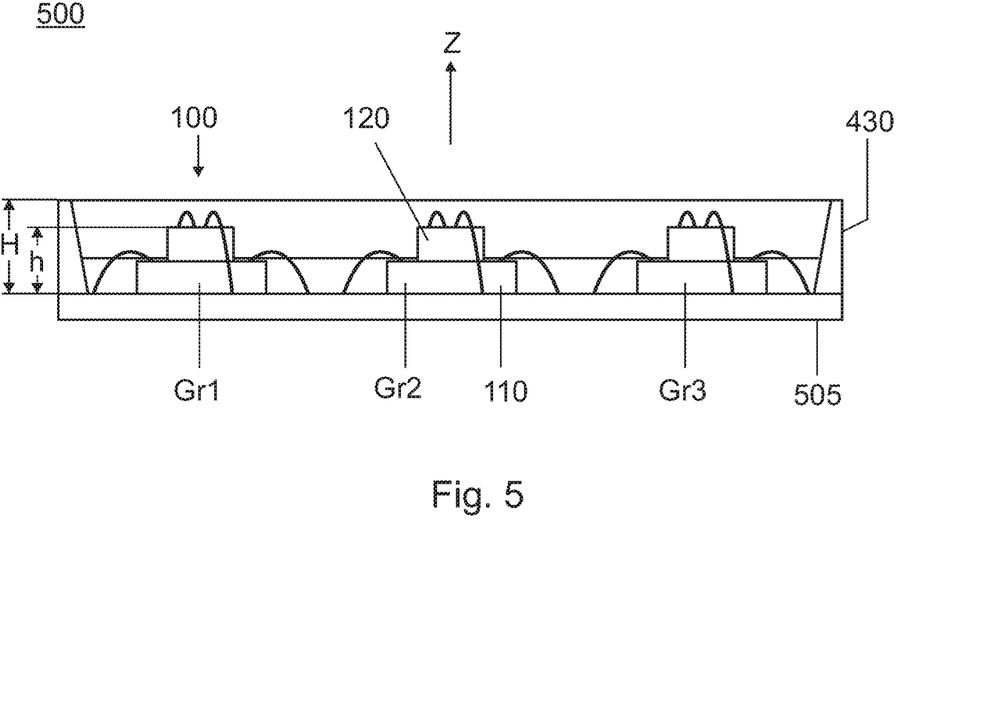
FIG. 5 shows a schematic representation of an LED module according to a first embodiment in a sectional representation.

FIG. 5 shows a schematic representation of an LED module 500 according to a first embodiment in a sectional representation. The LED module 500 includes a common substrate 505, on which a plurality of LED units 100 are arranged. The LED units 100 are configured according to FIG. 1. In respect of the basic description of the LED units 100, reference is therefore made to the description of FIG. 1. A housing wall 430, which extends in the direction of the emission direction Z, is arranged on the substrate 505. The housing wall fully encloses the LED units 100, the internal height H of the housing wall being greater than the height h of the arrangement consisting of the first LED chip 110 and the second LED chip 120.

A plurality of LED units 100 arranged on the common substrate form a first group Gr1, a second group Gr2 and a third group Gr3. Within a group, all the LED units 100 are electrically conductively connected to one another. All the LED units of a group are supplied with uniform electrical parameters. Each group may be supplied with uniform or different electrical parameters.

By the selection of suitable LED units 100, by the electrical interconnection of a plurality of LED units 100 to form a plurality of groups Gr1, Gr2, Gr3 and by suitable electrical operating parameters for each group, the LED module may be adjusted flexibly for different lighting technology requirements.

Figure 6:
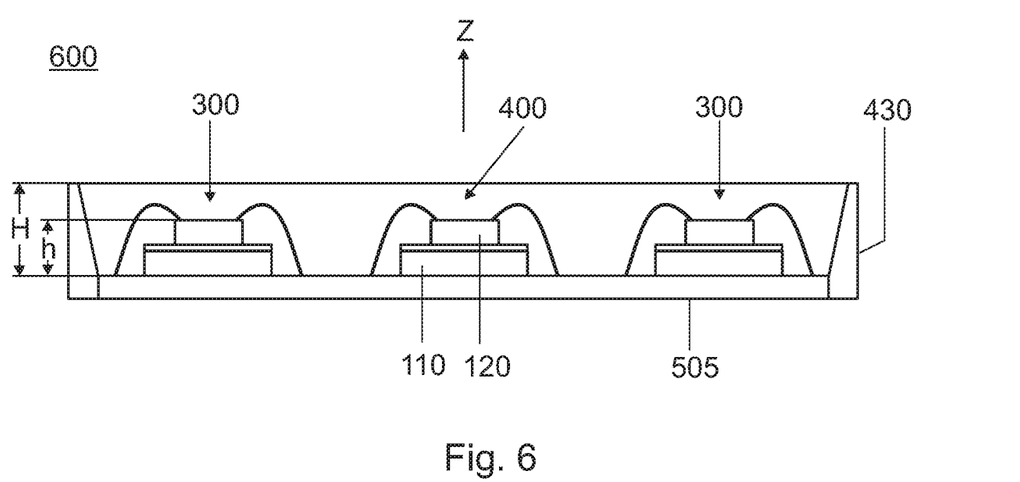
FIG. 6 shows a schematic representation of an LED module according to a second embodiment in a sectional representation.

FIG. 6 shows a schematic representation of an LED module 600 according to a second embodiment in a sectional representation. The LED module 600 includes a common substrate 505, on which a plurality of LED units 300, 400 are arranged. The LED units 300, 400 are configured according to FIG. 3 and FIG. 4. In respect of the basic description of the LED units 300, 400, reference is made to the description of FIG. 3 and FIG. 4. A housing wall 430, which extends in the direction of the emission direction Z, is arranged laterally on the substrate 505. The housing wall fully encloses the LED units 300, 400, the internal height H of the housing wall being greater than the height h of the arrangement consisting of the first LED chip 110 and the second LED chip 120.

The housing wall 430 includes a reflective surface 440. The reflective surface 440 of the housing wall 430 is formed from the base material of the housing wall, a plastic. It is furthermore possible for the reflective surface 440 to include a reflective coating, for example titanium dioxide embedded in a matrix material such as silicone. It is also possible for the reflective surface 440 to include or be formed by a metallization, for example an aluminum layer or a silver layer, or a white coating material. During operation of the LED module 600, the effect of the reflective surface 430 is that a particularly high proportion of the emitted light is reflected at the surface and is still available to the LED module 600. This contributes to a particularly high efficiency of the LED module, since optical losses in the LED module are minimized.

The housing wall 430 has a wedge-shaped basic shape, the width of the housing wall 430 decreasing in the direction of the emission direction Z. During operation of the LED module 600, the effect of the wedge-shaped housing wall 430 is that an increased proportion of the light striking the housing wall 430 is reflected obliquely back into the LED module 600. This contributes to particularly good color mixing of the emitted light of the LED module 600.

The LED unit and the LED module have been described with the aid of some embodiments in order to illustrate the underlying concept. The embodiments are in this case not restricted to particular feature combinations. Even though some features and configurations have been described only in connection with one particular embodiment or individual embodiments, they may respectively be combined with other features from other embodiments. It is likewise possible for individual described features or particular configurations to be omitted or added in embodiments so long as the general technical teaching remains implemented.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes that come within the meaning and range of equivalency of the claims are therefore intended to be embraced.

LIST OF REFERENCES

LED unit 100
Substrate 105
First LED chip 110
First light exit surface 115
Second LED chip 120
Second light exit surface 125
Bonding wire of first LED chip 130
First conversion layer 135
Second conversion layer 140
Arrangement surface 145
Mirroring 150
Bonding wire of second LED chip 160
Current contacts of first LED chip 210
Current contacts of second LED chip 220
LED unit 300
Reflective surface 310
Translucent layer 320
LED unit 400
Reflective layer 410
Housing wall 430
Reflective surface 440
LED module 500
Common substrate 505
LED module 600
Height extent a1
Lateral extent a2
First group Gr1
Second group Gr2
Third group Gr3
Internal height (housing wall) H
Height (chip arrangement) h
Emission direction Z

The invention claimed is:

1. An LED unit, comprising:
    a substrate;
    a first LED chip comprising a first light exit surface; wherein the first LED chip is arranged on the substrate in such a way that light emitted by the first LED chip is emitted in an emission direction of the LED unit,
    a second LED chip comprising a second light exit surface; wherein the second LED chip is arranged over the first LED chip in such a way that the second LED chip at least partially covers the first LED chip and light emitted by the second LED chip is emitted in the emission direction of the LED unit,
    a first conversion layer at least partially covering the first light exit surface and/or at least partially enclosing the first LED chip; wherein the first conversion layer is configured to convert the light emitted from the first LED chip into warm-white light; and
    a second conversion layer at least partially encapsulating the second LED chip;
    wherein the second conversion layer is configured to convert the light emitted from the second LED chip into cold-white light;
    wherein the color temperature of the light emitted from the LED unit ranges from 2700 K to 10000 K.

2. The LED unit as claimed in claim 1, wherein the first LED chip and the second LED chip comprise separate, spatially separated current contacts.

3. The LED unit as claimed in claim 1, wherein the first conversion layer and the second conversion layer are matched to one another in such a way that the light emitted during sole operation of the first LED chip is converted into warm-white light.

4. The LED unit as claimed in claim 1, wherein the first conversion layer and the second conversion layer are matched to one another in such a way that the light emitted during sole operation of the second LED chip is converted into cold-white light.

5. The LED unit as claimed in claim 1, wherein the first LED chip and/or the second LED chip comprises mirroring in the region of an arrangement surface with respect to the substrate or with respect to the first LED chip.

6. The LED unit as claimed in claim 1, further comprising a translucent layer at least partially covering the second light exit surface.

7. The LED unit as claimed in claim 6, wherein the translucent layer comprises a silicone layer having particles configured for light scattering.

8. The LED unit as claimed in claim 1, wherein the second light exit surface is at least partially covered with a reflective layer.

9. The LED unit as claimed in claim 1, further comprising a housing wall arranged on the substrate or laterally with respect to the substrate, wherein the housing wall extends in the direction of the emission direction and fully encloses the first LED chip and the second LED chip, the height of the housing wall being greater than the height of the arrangement consisting of the first LED chip and the second LED chip.

10. An LED module having a plurality of LED units as claimed in claim 1.

11. The LED module as claimed in claim 10, wherein all the LED units share a common substrate.

12. The LED module as claimed in claim 10, further comprising a housing wall arranged on the common substrate or laterally with respect to the common substrate, wherein the housing wall extends in the direction of the emission direction and fully encloses the LED units, the height of the housing wall being greater than the height of the arrangements consisting of first LED chips and second LED chips.

13. The LED unit as claimed in claim 1, wherein the second LED chip is arranged directly on the first LED chip, and wherein the first conversion layer laterally encloses the first LED chip.

14. The LED unit as claimed in claim 1, wherein the first conversion layer covers the first light exit surface, and the second conversion layer encapsulates the first LED chip and the second LED chip.

15. An LED unit, comprising:
    a substrate;
    a first LED chip comprising a first light exit surface; wherein the first LED chip is arranged on the substrate in such a way that light emitted by the first LED chip is emitted in an emission direction of the LED unit;
    a second LED chip comprising a second light exit surface; wherein the second LED chip is arranged over the first LED chip in such a way that the second LED chip at least partially covers the first LED chip and light emitted by the second LED chip is emitted in the emission direction of the LED unit; wherein the second LED chip is arranged directly on the first LED chip;
    a first conversion layer at least partially covering the first light exit surface and/or at least partially enclosing the first LED chip; and
    a second conversion layer at least partially encapsulating the second LED chip.

16. The LED unit of claim 15, wherein the first conversion layer laterally encloses the first LED chip.

17. The LED unit of claim 15, wherein the first conversion layer covers the first light exit surface, and the second conversion layer encapsulates the first LED chip and the second LED chip.

* * * * *